United States Patent [19]
Hoang et al.

[11] Patent Number: 5,365,479
[45] Date of Patent: Nov. 15, 1994

[54] ROW DECODER AND DRIVER WITH SWITCHED-BIAS BULK REGIONS

[75] Inventors: Loc B. Hoang; Khoi V. Dinh, both of San Jose; Jitendra R. Kulkarni, Mountain View, all of Calif.

[73] Assignee: National Semiconductor Corp., Santa Clara, Calif.

[21] Appl. No.: 206,446

[22] Filed: Mar. 3, 1994

[51] Int. Cl.$^5$ .............................................. G11C 11/40
[52] U.S. Cl. .............................. 365/189.29; 365/185; 365/189.11; 365/218; 365/230.06
[58] Field of Search ...................... 365/189.09, 189.11, 365/230.06, 185, 218

[56] References Cited

U.S. PATENT DOCUMENTS

| | | | |
|---|---|---|---|
| 5,251,172 | 10/1993 | Yamauchi | 365/189.09 |
| 5,265,052 | 11/1993 | D'Arrigo et al. | 365/189.11 |
| 5,272,368 | 12/1993 | Turner et al. | 365/185 |
| 5,287,536 | 2/1994 | Schreck et al. | 365/230.06 |
| 5,291,446 | 3/1994 | Van Buskirk et al. | 365/189.09 |

OTHER PUBLICATIONS

A 5-V-Only 16-Mb Flash Memory With Sector Erase Mode, Jinbo et al., IEEE Journal of Solid-State Circuits, vol. 27, No. 11, Nov. 1992.

A New Erasing and Row Decoding Scheme for Low Supply Voltage Operation 16Mb/64Mb Flash EE-PROMs, Miyawaki et al., LSI R&D Lab., Mitsubishi Electric Corp.

A 5-V-Only Operation 0.6 μm Flash EEPROM with Row Decoder Scheme in Triple-Well Structure, Umezawa et al., IEEE Journal of Solid-State Circuits, vol. 27, No. 11.

NOR Virtual Ground (NVG)—A New Scaling Concept for Very High Density Flash EEPROM and Its Implementation in a . . . , National Semiconductor, IEDM 93-15.

New Erasing and Row Decoding Scheme for Low Supply Voltage . . . Journal of Solid-State Circuits, vol. 27, No. 4, Apr. 1992.

*Primary Examiner*—Joseph E. Clawson, Jr.
*Attorney, Agent, or Firm*—Steven F. Caserza

[57] ABSTRACT

A novel row decoder/driver circuit in which switched bias voltages are applied to the bulk regions in order to minimize the maximum voltage differential appearing across transistor devices. This allows the decoder/driver circuit to be conveniently fabricated and designed to allow normal transistors rather than more complex and expensive high voltage transistors, to form the row decoder/driver. The bulk regions containing the pull-up and pull-down transistors are biased by voltages which are switched during erasure depending on whether the row line is selected or deselected in order to assure that excessive voltages do not appear across based upon the voltage levels applied to the transistors.

18 Claims, 2 Drawing Sheets

ROW DECODER AND DRIVER WITH SWITCHED-BIAS BULK REGIONS

FIELD OF THE INVENTION

This invention pertains to electronic circuits, and more specifically to row decoder and driver circuitry suitable for implementation in memory circuits employing a relatively high voltage differential during at least one operating state, such as erasure.

BACKGROUND OF THE INVENTION

Memory circuits are well known, and include an array of memory cells, each capable of storing a bit of information. In order to appropriately access a desired word of information, comprising a plurality of bits, appropriate row decoder/driver circuits are used which select appropriate row lines for access. Similarly, column accessing circuitry is often employed to select an appropriate number of bits within the row for output.

FIG. 1 is a block diagram of a typical flash memory circuit including a memory array 101 having a plurality of memory cells such as memory cell 101-N-M. Address circuitry 104 applies row information to row decoder 102 defining which of the N rows of memory array 101 is to be selected for reading or writing. Similarly, column decoder 103 receives address information defining which one or ones of the M columns of memory array 101 are to be selected. Data read from or to be applied to memory array 101 is stored in data buffer 105.

Typical memory devices operate between ground (0 volts) and a positive supply of voltage of approximately 5 volts. However, memory devices which are capable of being programmed often utilize supply voltages in excess of these voltages. For example, a typical nonvolatile flash EPROM memory might use 0 and 5 volt supplies during a normal reading operation, but require a voltage of approximately 12 volts during programming and a voltage of approximately $-12$ volts during erasure. Modern memory devices include on chip circuitry to generate these voltages in excess of normal (and externally applied) supply voltage levels. However, it is imperative that the memory devices be fabricated in order to withstand any breakdown failures in the path which applies these high voltage levels to the memory cells being programmed or erased. Thus, referring to FIG. 1, which is an exemplary block diagram of a typical memory circuit, row decoder 102 is capable of withstanding the high voltages applied by row decoder 102 to memory cell array 101 during programming and erasure.

In order to provide circuitry which is capable of withstanding these high voltages, one technique is to utilize a triple-well CMOS structure such as described in "A 5-V-Only 16-Mb Flash Memory with Sector Erase Mode," Jinbo, et al., *IEEE Journal of Solid-State Circuits*, Vol. 27, No. 11, November 1992, pgs. 1547–1553. As described by Jinbo et al., peripheral N channel and P channel transistors are formed in a conventional manner, and memory cell transistors are formed in a P well which in turn is formed with an N well within a P type substrate, thereby forming a "triple-well" CMOS structure. Similarly, negative voltage N channel transistors are formed in a separate one or more triple-well structures. This allows transistors which are subjected to high voltages to be properly isolated and capable of avoiding breakdown during the presence of high voltage differentials.

Other examples of prior art triple-well CMOS memory devices are described in "New Erasing and Row Decoding Scheme for Low Supply Voltage Operation 16-Mb/64-Mb Flash Memories", Miyawaki, et al., *IEEE Journal of Solid-State Circuits*, Vol. 27, No. 4, April 1992, pages 583–588, and "5-V-Only Operation 0.6-μm Flash EEPROM with Row Decoder Scheme in Triple-Well Structure", A. Umezawa, et al, *IEEE Journal of Solid-State Circuits*, Vol. 27, No. 11, November 1992.

TABLE 1

| | (FIG. 2) | | | | | | | | | | | |
|---|---|---|---|---|---|---|---|---|---|---|---|---|
| | Signal (Volts) | | | | | | | | | | | |
| | blkx | | rx | | rbx | | WL | | P well (rsx) | | N well (Vpp) | |
| Mode | Sel | Des | Sel | Des | Sel | Del | Sel | Des | Sel | Des | Sel | Des |
| Read | 0 | 5 | 5 | 0 | 0 | 5 | 5 | 0 | 0 | 0 | 5 | 5 |
| Program | 0 | 12 | 12 | 0 | 0 | 12 | 12 | 0 | 0 | 0 | 12 | 12 |
| Erase | 5 | −12 | 5 | 5 | −12 | −12 | −12 | 5 | −12 | −12 | 5 | 5 |

FIG. 2 is a schematic diagram of one example of a prior art row driver capable of withstanding high voltages applied during programming and erasure, with the operation of the circuit of FIG. 2 shown in Table 1. As shown in FIG. 2, row driver circuit 200 includes a pull up transistor 207 formed in N well 210 tied to Vpp, and pull down transistors 208 and 209 formed within P well 211 tied to rsx. When row driver circuit 200 is used in a triple-well CMOS structure, it receives a block select signal blkx on lead 201, which is capable of selecting a desired block, containing a plurality of rows, of the memory array. Row pre-decode signals rx and rsx are applied to leads 202 and 203, respectively, to be used with block select signal blkx during reading and programming to select a desired row by applying the appropriate signal on word line 205. Note that during erasure, row pre-decode signals rx and rsx are fixed voltages, as an entire block, containing a plurality of rows, is erased simultaneously. As shown in Table 1, it is seen that during reading only 0 and 5 volts are applied to row decoder 200 and thus the memory array. However, during programming, a high voltage of 12 volts is applied at appropriate times, and during erasure a $-12$ volts is applied at appropriate times. Thus, the circuit of FIG. 2, if it is to be applied to a high voltage system, must include transistors 207, 208 and 209 fashioned as high voltage devices, for example by utilizing a thick gate oxide and particular care in junction formation to prevent breakdown from occurring given the voltage differential of up to approximately 18 volts. This requires additional fabrication limitations and steps, adding to the cost of the fabrication process. Accordingly, it has been determined that utilizing a typical row decoder and operating voltage levels requires extra care and expense, which is, of course undesirable.

SUMMARY

A novel row decoder/driver circuit in which switched bias voltages are applied to the bulk regions in order to minimize the maximum voltage differential appearing across transistor devices. This allows the decoder/driver circuit to be conveniently fabricated and designed to allow normal transistors rather than more complex and expensive high voltage transistors, to form the row decoder/driver. In accordance with this invention, the bulk regions containing the pull-up and pull-down transistors are biased by voltages which are switched during erasure depending on whether the row line is selected or deselected in order to assure that excessive voltages do not appear across based upon the voltage levels applied to the transistors.

BRIEF DESCRIPTION OF DRAWINGS

The foregoing and other objects of the invention will become apparent in reading the following detailed description and in reference to the following drawings.

DETAILED DESCRIPTION

Figure 3:
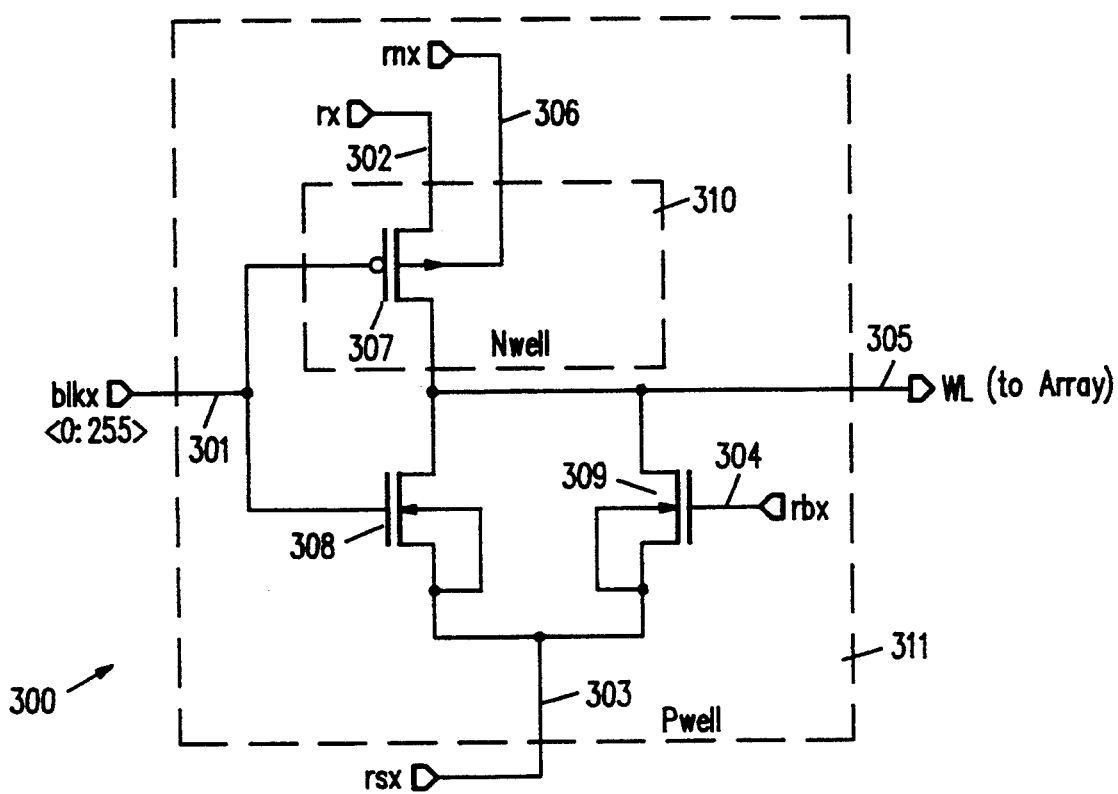
FIG. 3 is a schematic diagram of one embodiment of a row decoder constructed in accordance with the teachings of this invention suitable for use as a row decoder of row decoder array 102 and capable of operating at high voltage differentials without the need for high voltage devices.

In accordance with the teachings of this invention, one embodiment of a novel row decoder/driver circuit suitable for use at high voltage differentials is shown in the schematic diagram of FIG. 3. This invention is suitable for use with, for example, EEPROM devices utilizing any of a number of well known cell structures and array organizations, as well as the novel EEPROM device disclosed in "NOR Virtual Ground (NVG)- A New Scaling Concept for Very High Density FLASH EEPROM and its Implementation in a 0.5 $\mu$m Process" by A. Bergemont, et al, *IEEE* (1993), *National Semiconductor*, Santa Clara, CA, IEDM 93-15 IEDM 93-18, 2.2.1–2.2.4.

Row decoder/driver circuit 300 is conveniently fabricated and designed in order to allow normal transistors to serve as transistors 307, 308, and 309 by carefully avoiding high voltage differentials across each of these transistors. Therefore, the circuit of this invention is suitable for use in high voltage requirements, without requiring any one or more of transistors 307, 308, and 309 to be fabricated as high voltage devices, with the associated process and layout disadvantages of such transistors when used in the prior art.

TABLE 2

(FIG. 3)

| | \multicolumn{2}{c}{blkx} | \multicolumn{2}{c}{rx} | \multicolumn{2}{c}{rbx} | \multicolumn{2}{c}{WL} | \multicolumn{2}{c}{P well (rsx)} | \multicolumn{2}{c}{N well (mx)} |

| Mode | blkx Sel | blkx Des | rx Sel | rx Des | rbx Sel | rbx Del | WL Sel | WL Des | P well (rsx) Sel | P well (rsx) Des | N well (mx) Sel | N well (mx) Des |
|---|---|---|---|---|---|---|---|---|---|---|---|---|
| Read | 0 | 5 | 5 | 0 | 0 | 5 | 5 | 0 | 0 | 0 | 5 | 5 |
| Program | 0 | 12 | 12 | 0 | 0 | 12 | 12 | 0 | 0 | 0 | 12 | 12 |
| Erase | 0 | 0 | 0 | 5 | 0 | 0 | −12 | 5 | −12 | 0 | 0 | 5 |

The operating voltages of row decoder/driver 300 are shown in Table 2. Block select signal blkx is received on lead 301, and row pre-decode signals rx and rsx are received on leads 302 and 303, as in the case of the prior art circuit of FIG. 2. Signal rbx serves as a row line select signal. The resulting output signal is applied to the memory array via word line 305. The exemplary circuit of FIG. 300 includes P channel pull up transistor 307 formed within a first N-type bulk region such as N well 310, and N channel pull-down transistors 308 and 309 formed in a second bulk region such as P well 311.

Figure 1:
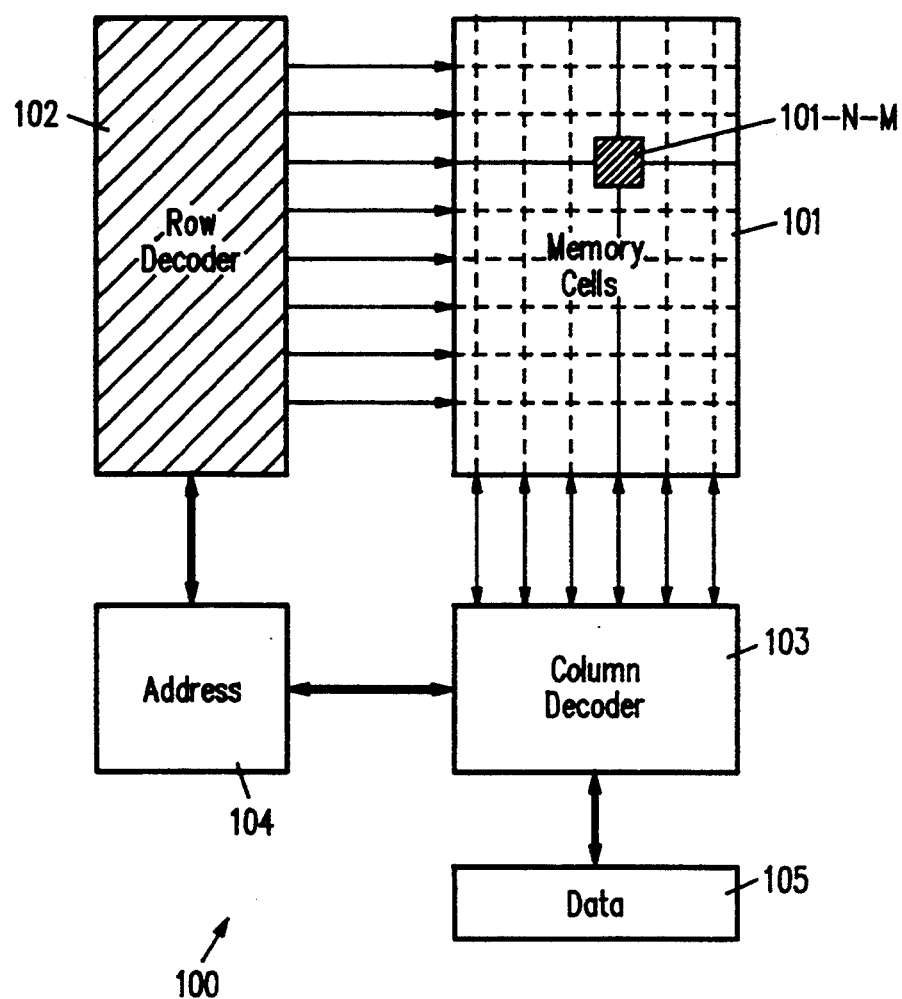
FIG. 1 is a block diagram depicting a typical prior art memory circuit.
Figure 2:
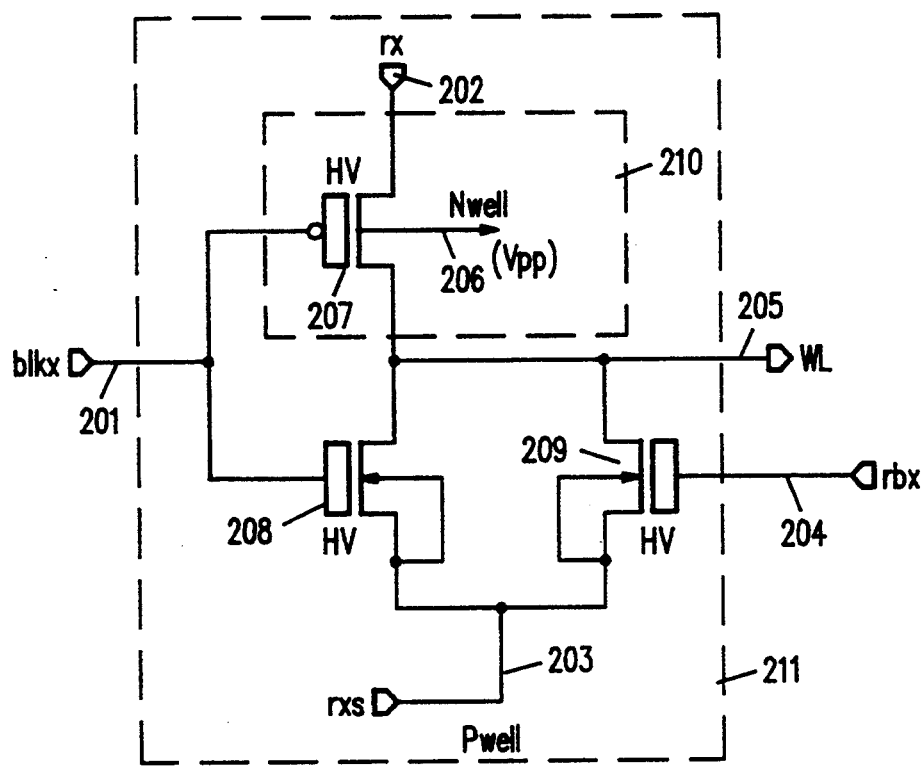
FIG. 2 is a schematic diagram depicting a typical prior art row decoder circuit suitable for use as one row decoder within row decoder array 102 of the circuit of FIG. 1, which is capable of operating at a high voltage differential.

Unlike the prior art circuit of FIG. 2, in accordance with the teachings of this invention, one or both of N well 310 and P well 311 are provided with bulk bias voltages selected during erasure dependent on whether row line 305 is selected or deselected, for example, N well 310, within which P channel pull-up transistor 307 is formed, is tied via signal mx to an appropriate N well voltage, as shown in Table 2, which allows the voltage differential appearing across transistor 307 to never exceed 12 volts. These maximum possible voltage differentials are the difference between the N well voltage and the voltages appearing on either the gate 301 (blkx), source 302 (rx), or drain 305 (word line voltage) of P channel transistor 307. Thus, in accordance with the teachings of this invention, by appropriately applying to N well 310 a selected voltage mx via lead 306, the voltage differential seen by transistor 307 is reduced from that of the prior art circuit of FIG. 2, allowing P channel transistor 307 to be fabricated as a normal transistor having normal breakdown voltages, and thus overcoming the problems associated with the prior art circuit of FIG. 2 with respect to forming a pull-up transistor with thick oxide and additional steps taken to prevent junction breakdown.

Similarly, in accordance with the teachings of this invention, P well 311 is held at a voltage applied by rsx so that the maximum voltage differential appearing across transistors 308 and 309 formed within P well 311 never exceeds 12 volts. The maximum voltage differential appearing across N channel transistors 308 and 309 formed within P well 311 is calculated as the difference between the P well voltage and the voltages appearing on leads 304 (signal rbx), 301 (signal blkx) and word line 305. Thus, in accordance with the teachings of this invention, by applying appropriate voltages to P well 311, the maximum voltage differential appearing across N channel transistors 308 and 309 formed within P well 311 is held to 12 volts, thereby allowing N channel transistors 308 and 309 to be fabricated as normal transistors without fear of breakdown, overcoming the disadvantages described above with respect to prior art circuit 200 of FIG. 2 wherein transistors 208 and 209 must be fabricated as high voltage devices.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A row line circuit comprising:
    a first bulk region coupled to a first bulk bias voltage;
    a second bulk region coupled to a second bulk bias voltage;
    a pull up transistor formed in said first bulk region having a first lead coupled to a first voltage signal, a second lead coupled to said row line, and a control terminal coupled to receive a block select signal;
    a first pull down transistor formed in said second bulk region having a first lead coupled to said row line, a second lead coupled to a second voltage signal, and a control line coupled to receive said block select signal;
    a second pull down transistor formed in said second bulk region having a first lead coupled to said row line, a second lead coupled to said second voltage signal, and a control lead couple to receive a control signal,
    wherein one or both of said first and second bulk bias voltages are selected during erasure of memory cells on said row line to a first value when said row line is selected and a second value when said row line is deselected.

2. A structure as in claim 1 wherein said second voltage signal is said second bulk bias voltage.

3. A structure as in claim 1 wherein both said first and second bulk bias voltages are selected during erasure of memory cells on said row line to an associated first value when said row line is selected and an associated second value when said row line is deselected.

4. A structure as in claim 1 wherein said transistors are all formed as low voltage devices.

5. A structure as in claim 4 wherein said first and second bulk bias voltages are selected during erasure to prevent said transistors from being subjected to a voltage differential greater than the breakdown voltages of said transistors.

6. A structure as in claim 1 wherein said pull up transistor comprises a P channel transistor and said first bulk region comprises an N type region.

7. A structure as in claim 6 wherein said pull down transistors comprise N channel transistors and said second bulk region comprises a P type region.

8. A structure as in claim 7 wherein said first bulk region is formed within said second bulk region.

9. A structure as in claim 1 wherein, during erasure:
    said block select signal is at 0 volts and said row select signal is at 0 volts;
    when said row line is selected:
        said first bulk bias voltage is at 0 volts;
        said second bulk bias voltage is at −12 volts; and
        said first voltage is at 0 volts,
        thereby providing −12 volts to said row line;
    when said row line is deselected:
        said first bulk bias voltage is at 5 volts;
        said second bulk bias voltage is at 0 volts; and
        said first voltage is at 5 volts,
        thereby providing 5 volts to said row line.

10. A method for operating row line circuit comprising:
    a first bulk region coupled to a first bulk bias voltage;
    a second bulk region coupled to a second bulk bias voltage;
    a pull up transistor formed in said first bulk region having a first lead coupled to a first voltage signal, a second lead coupled to said row line, and a control terminal coupled to receive a block select signal;
    a first pull down transistor formed in said second bulk region having a first lead coupled to said row line, a second lead coupled to a second voltage signal, and a control line coupled to receive said block select signal;
    a second pull down transistor formed in said second bulk region having a first lead coupled to said row line, a second lead coupled to said second voltage signal, and a control lead couple to receive a control signal, said method comprising the steps of:
    selecting one or both of said first and second bulk bias voltages during erasure of memory cells on said row line to a first value when said row line is selected and a second value when said row line is deselected.

11. A method as in claim 10 wherein said second voltage signal is said second bulk bias voltage.

12. A method as in claim 10 wherein both said first and second bulk bias voltages are selected during erasure of memory cells on said row line to an associated first value when said row line is selected and an associated second value when said row line is deselected.

13. A method as in claim 10 wherein said transistors are all formed as low voltage devices.

14. A method as in claim 13 wherein said first and second bulk bias voltages are selected during erasure to prevent said transistors from being subjected to a voltage differential greater than the breakdown voltages of said transistors.

15. A method as in claim 10 wherein said pull up transistor comprises a P channel transistor and said first bulk region comprises an N type region.

16. A method as in claim 15 wherein said pull down transistors comprise N channel transistors and said second bulk region comprises a P type region.

17. A method as in claim 16 wherein said first bulk region is formed withing said second bulk region.

18. A structure as in claim 10 wherein, during erasure:
    said block select signal is at 0 volts and said row select signal is at 0 volts;
    when said row line is selected:
        said first bulk bias voltage is at 0 volts;
        said second bulk bias voltage is at −12 volts; and
        said first voltage is at 0 volts,
        thereby providing −12 volts to said row line;
    when said row line is deselected:
        said first bulk bias voltage is at 5 volts;
        said second bulk bias voltage is at 0 volts; and
        said first voltage is at 5 volts,
        thereby providing 5 volts to said row line.

* * * * *